Nov. 24, 1964 J. PRITULSKY 3,158,425

PIN SOCKET FOR PRINTED CIRCUIT BOARD

Filed May 25, 1961 2 Sheets-Sheet 1

INVENTOR.
James Pritulsky
BY
Curtis, Morris + Safford

INVENTOR.

BY

United States Patent Office
3,158,425
Patented Nov. 24, 1964

3,158,425

PIN SOCKET FOR PRINTED CIRCUIT BOARD

James Pritulsky, Harrisburg, Pa., assignor to AMP Incorporated, Harrisburg, Pa.

Filed May 25, 1961, Ser. No. 112,625
4 Claims. (Cl. 339—258)

This invention relates, in general, to electrical sockets for detachably receiving pins, solid lead wires and the like, and more particularly to such pin sockets adapted to be applied to a printed circuit board.

Various types of pin sockets for printed circuit boards are known, but relatively expensive construction and insufficient flexibility to accommodate a range of pin sizes and printed circuit board hole diameters, especially where the board is to be put through a solder-dip process, have prevented such sockets from becoming a widespread adjunct to the printed circuit board technique. Accordingly, it is an object of the present invention to provide a pin socket having the capability of gripping a wide range of pin sizes, and applicable to a wide tolerance range to printed circuit board hole sizes.

Another object is to provide a pin socket having a spring body for resiliently fitting within a printed circuit board hole, yet which is closed along the sides and bottom to seal the interior of the socket against the passage of solder during solder-dipping the printed circuit board.

Another object is to provide an integral, one-piece socket spring-fitted in the printed circuit board and having an internal pin-contacting spring which is protected from contact by solder. Another object is to provide a pin socket of inexpensive construction that can be formed from sheet metal by standard mass-production techniques.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purposes of illustration in order that others skilled in the art may fully understand the invention and the principles thereof and the manner of applying it in practical use so that they may modify it in various forms, each as may be best suited to the conditions of a particular use.

Figures 1, 2, 3, 4:
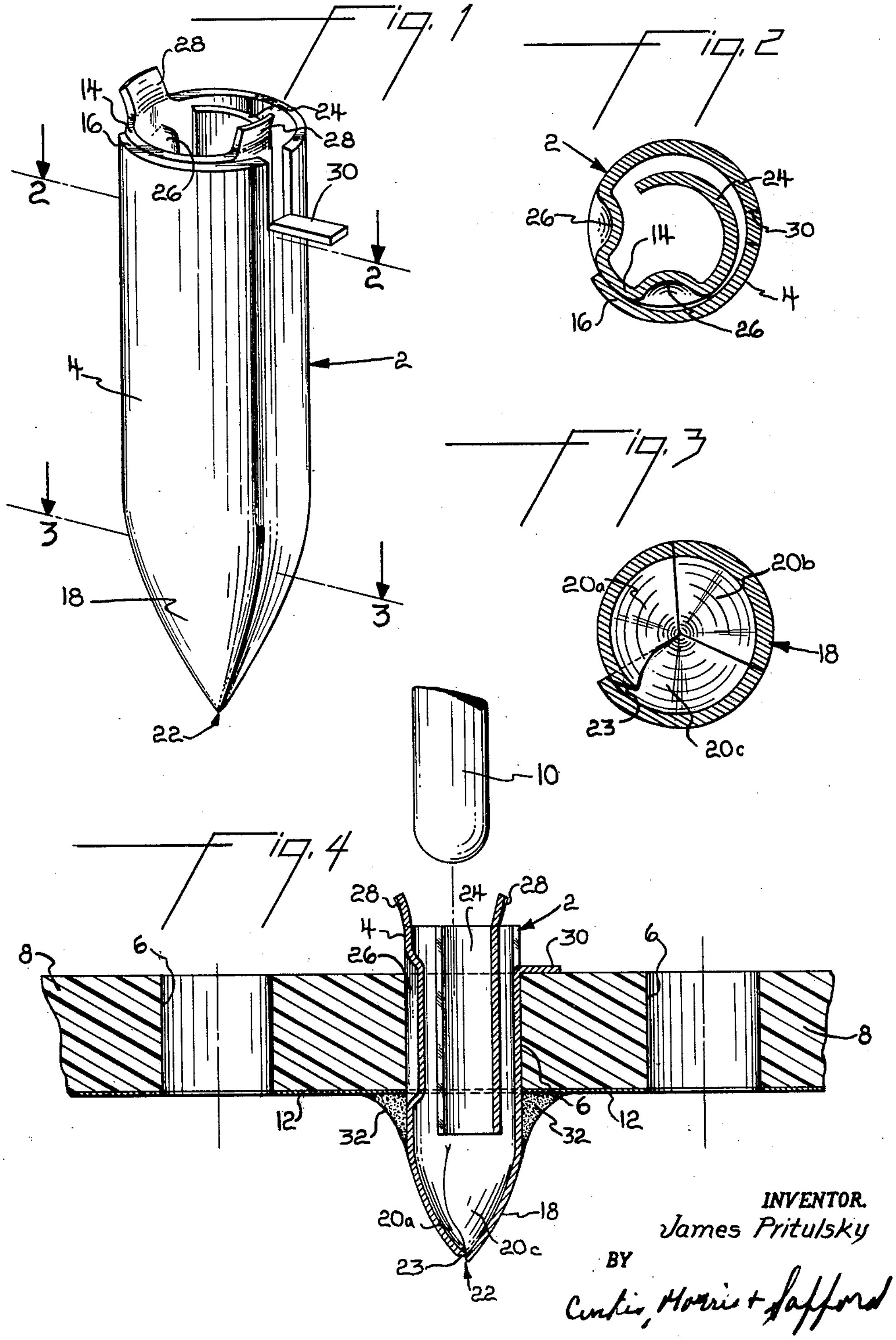
FIGURE 1 is a perspective view of a pin socket according to the present invention.
FIGURE 2 is a sectional view taken along lines 2—2 of FIGURE 1.
FIGURE 3 is a sectional view taken along lines 3—3 of FIGURE 1.
FIGURE 4 is a cross-sectional view on a reduced scale illustrating the assembly of the pin socket in a printed circuit board.

In the illustrative embodiment shown in the drawings, the pin socket, generally designated at 2, includes a barrel 4 which is constructed to be spring-fitted in an aperture 6 of a printed circuit board 8, and to receive a pin 10 to be conductively connected by the pin socket to circuit strips 12 of the printed circuit board. The relaxed diameter of barrel 4 will be at least as great as the maximum diameter of printed circuit board holes 6, and preferably slightly greater. Barrel 4 is seamed along its side, but at the seam has overlapping sides 14 and 16 which can slide past one another permitting barrel 4 resiliently to contract. Preferably, barrel sides 14 and 16 are in face-to-face contact to seal the sides of the socket and preclude entrance of solder into the socket interior after the socket is set in the printed circuit board and subjected to a solder-dipping operation, a technique well known in the art.

To seal the socket against solder entering through the bottom, the nose 18 at the bottom end of the socket is also closed. In the illustrative embodiment, nose 18 comprises three generally triangular sections 20a, 20b and 20c integrally extending from barrel 4 to converge at tip 22 which advantageously provides a lead-in point for automatic-machine setting of the sockets in the board as desired.

Relative to the seam of barrel 4, the end section 20a of nose 18 is at least partially underlapped so as not to interfere with the contraction or rolling of barrel 4 when it is set in the printed circuit board. The leading side edge of section 20a may also have an outside swedge or bevel 23 for ease of rolling during formation of nose 18 and facilitating contraction in later use.

To grip pin 10 resiliently as it is inserted in barrel 4, the inside lap or side 14 is extended and spaced from the inside walls of the barrel to form a spring 24. In the illustrative embodiment, spring 24 can comprise simply an extension of lap 14 rolled on a radius of curvature smaller than that of barrel 4, which thus resiliently unrolls upon insertion of a pin 10. Where pin 10 may be of especially fine size in relation to the diameter of barrel 4, for example, the leads of a transistor, longitudinal indentations 26 may be formed along the barrel sidewall opposite spring 24, thus to center the pin and to reduce the effective size of the socket in accommodation of the smaller pin. Alternatively, the spring may be more tightly rolled or cut diagonally more sharply across the inside of barrel 4, and in general it can be seen that spring 24 can take many shapes and constructions as will occur to those skilled in the art in accordance with the conditions of a particular use. To facilitate pin insertion, a pair of tabs 28 integrally extending from barrel 4 and spring 24 at the entrance end of the socket are outwardly flared, thus to guide the pin into the socket.

To limit insertion of the socket, a small tab 30 may be struck out of the end of barrel 4 to engage the top surface of circuit board 8, as best shown in FIGURE 4.

Figure 5:
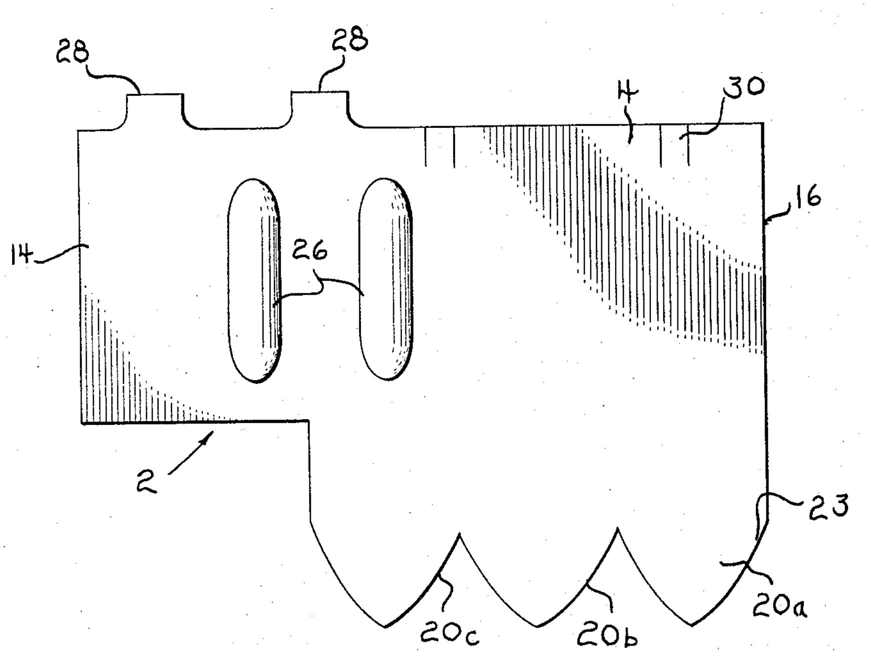
FIGURE 5 is a plan view on a slightly reduced scale of a partially preformed sheet metal blank of the pin socket of FIGURE 1.

In constitution, socket 2 may be formed of any suitable resilient metal, such as tin-plated brass or beryllium copper, and preferably from a thin-stock, sheet metal blank, as shown in FIGURE 5. It will be readily apparent to those skilled in the art that the socket construction described advantageously can be formed and rolled from such a sheet metal blank by high-speed, multislide and progressive die-stamping machines. Printed circuit board holes are usually circular, so preferably barrel 4 is rolled to cylindrical configuration to place its exterior surface closely adjacent the printed circuit strips 12 brought to the bottom edge of the board holes. Because of the stamped and rolled construction, it will be apparent that the pin socket of this invention can easily be made in any length or diameter desired to accept pins within a wide range centered about a pin of any nominal length and diameter.

In the assembly of the socket to the board, the frictional or spring-fit is, of course, of temporary importance and serves mainly to hold the socket during handling of the board prior to the soldering operation. It is important that the bottom and sides of the socket remain closed so that, after the socket is set in the board and the board is subjected to the soldering operation to form the solder fillet 32 connecting printed strips 12 to the external surface of the socket, there is no penetration of solder into the socket interior to interfere with proper spring action of spring 24. It will also be observed that barrel 4 can be designed to have a sufficiently tight fit in the board hole to effect a pressure engagement with any plating on the inside walls of a plated-through hole, not shown, whereupon a solder operation to form fillet 32 is unnecessary. Insertion of pin 10 into the socket will enhance the pressure engagement of barrel 4 with the hole sidewalls.

I claim:

1. An integral pin socket comprising a seamed barrel portion having free, relatively slidable overlapping sides at the seam to define the main body of the socket to adapt it for resiliently fitting within an aperture, and a spring portion within and extending from an edge of said barrel portion for resiliently gripping a pin inserted in the barrel portion.

2. An integral pin socket comprising a seamed barrel portion having overlapping sides in face-to-face relatively slidable engagement to define the main body of the socket to adapt it for resiliently fitting within an aperture, a plurality of complementary nose sections extending from one end of the barrel portion and formed to close said end, said nose sections having lapped meeting edges along the seam of said barrel portion, and a spring portion within the barrel portion for resiliently gripping a pin inserted into the other end of the barrel portion.

3. An integral pin socket comprising a seamed barrel portion having overlapping sides for resiliently fitting within an aperture, an internal lap of the barrel portion being extended, and a spring portion carried on the extension of said internal lap for resiliently gripping a pin inserted within the barrel portion.

4. An integral pin socket of sheet metal comprising a seamed cylindrical barrel portion having overlapping sides in engagement closing the seam for resiliently fitting within an aperture, extensions from one end of the barrel portion closing that end, an internal lap of the barrel portion being extended and curved on a smaller radius than said barrel portion to form a spring for resiliently gripping a pin in the barrel portion.

References Cited in the file of this patent

UNITED STATES PATENTS

| | | |
|---|---|---|
| 1,266,114 | Francis | May 14, 1918 |
| 2,424,528 | Wild | July 22, 1947 |
| 2,546,061 | Beauvais | Mar. 20, 1951 |
| 2,667,544 | Griffiths | Jan. 26, 1954 |
| 2,866,174 | Gorike | Dec. 23, 1958 |
| 2,876,276 | Melton | Mar. 3, 1959 |
| 2,894,240 | Mautner | July 7, 1959 |

FOREIGN PATENTS

| | | |
|---|---|---|
| 1,250,743 | France | Dec. 5, 1960 |
| 1,263,085 | France | Apr. 24, 1961 |